(12) United States Patent
Hermann (10) Patent No.: US 11,172,586 B2
(45) Date of Patent: Nov. 9, 2021

(54) MODULAR MULTIPURPOSE TELECOMMUNICATIONS ENCLOSURE

(71) Applicant: Richard Hermann, Carlstadt, NJ (US)

(72) Inventor: Richard Hermann, Carlstadt, NJ (US)

( * ) Notice: Subject to any disclaimer, the term of this patent is extended or adjusted under 35 U.S.C. 154(b) by 245 days.

(21) Appl. No.: 16/688,920

(22) Filed: Nov. 19, 2019

(65) Prior Publication Data
US 2020/0329577 A1 Oct. 15, 2020

Related U.S. Application Data

(63) Continuation-in-part of application No. 29/686,989, filed on Apr. 9, 2019.

(51) Int. Cl.

| | |
|---|---|
| *H05K 5/06* | (2006.01) |
| *H05K 5/00* | (2006.01) |
| *H05K 5/02* | (2006.01) |
| *G08B 13/196* | (2006.01) |
| *G03B 17/08* | (2021.01) |
| *H05K 7/14* | (2006.01) |

(52) U.S. Cl.
CPC .............. *H05K 5/061* (2013.01); *G03B 17/08* (2013.01); *G08B 13/19619* (2013.01); *H05K 5/0013* (2013.01); *H05K 5/0056* (2013.01); *H05K 5/0095* (2013.01); *H05K 5/0213* (2013.01); *H05K 5/0247* (2013.01); *H05K 7/1417* (2013.01)

(58) Field of Classification Search
CPC .............. G03B 17/08; G08B 13/19619; H05K 5/0013; H05K 5/0056; H05K 5/0095; H05K 5/0213; H05K 5/0247; H05K 5/051; H05K 7/1417
See application file for complete search history.

(56) References Cited

U.S. PATENT DOCUMENTS

| | | | |
|---|---|---|---|
| 5,485,350 A | * | 1/1996 | Hecht ...................... H02B 1/56 165/80.3 |
| 5,923,531 A | | 7/1999 | Bachman et al. |
| 6,245,995 B1 | | 6/2001 | Coorod et al. |
| 6,375,369 B1 | | 4/2002 | Schneider et al. |

(Continued)

FOREIGN PATENT DOCUMENTS

| | | | |
|---|---|---|---|
| CA | 2 962 267 | * | 3/2016 |
| WO | WO2017156283 A1 | | 9/2017 |

*Primary Examiner* — Carl J Arbes (57) ABSTRACT

A modular multipurpose telecommunications enclosure has a plurality of walls, to which are removably affixed a plurality of mounting bulkheads. Each mounting bulkhead has a plurality of mounting holes arranged into a specified hole pattern that is configured to receive and mount cameras or other electronics units from various different equipment manufacturers which employ different hole patterns in their mounting kits. The enclosure is made of a high thermal conductivity material such as aluminum to promote convection cooling and employs one or more airflow vents to keep any internal electronics from reaching undesirably high temperatures during operation. The enclosure also features antenna mounting holes to accommodate various wireless communication antennas, as well as a mounting bracket to allow easy installation of the enclosure in a desired location. The enclosure is rugged and durable against the elements to facilitate purposes such as video monitoring of an outdoor area.

13 Claims, 6 Drawing Sheets

(56) References Cited

U.S. PATENT DOCUMENTS

| | | | |
|---|---|---|---|
| 6,983,095 B2* | 1/2006 | Reagan et al. | 385/135 |
| 7,496,269 B1* | 2/2009 | Lee | 165/135 |
| 7,588,492 B2 | 9/2009 | Ballard et al. | |
| 7,737,360 B2* | 6/2010 | Wiemeyer | H04Q 1/13 174/50 |
| 8,143,519 B2* | 3/2012 | Puccini | H02B 1/32 174/59 |
| 8,461,453 B2* | 6/2013 | Puccini | H02B 1/21 174/59 |
| 8,717,751 B2 | 5/2014 | Marker | |
| 9,279,950 B2* | 3/2016 | Lichoulas et al. | G02B 6/4452 |
| 9,615,470 B2* | 4/2017 | Sherwood | H05K 5/02 |
| 9,882,362 B2* | 1/2018 | Carapella | G02B 6/4448 |
| 9,952,397 B2* | 4/2018 | Hanson | H02G 3/081 |
| 10,581,231 B1* | 3/2020 | Perez | H02G 3/121 |

\* cited by examiner

MODULAR MULTIPURPOSE TELECOMMUNICATIONS ENCLOSURE

The current application is a continuation-in-part (CIP) application of the U.S. design application Ser. No. 29/686,989 filed on Apr. 9, 2019.

FIELD OF THE INVENTION

The present invention relates generally to telecommunications. More particularly, the present invention relates to an enclosure for a telecommunications unit.

BACKGROUND OF THE INVENTION

It may often be desirable for a business or other entity to install electronic equipment in an outdoor setting, particularly for the purpose of video surveillance or monitoring of an area through other means. As electronic equipment is typically sensitive to environmental hazards such as heat, wind, and moisture, any electronic equipment installed outdoors needs to be adequately protected from the environment.

Furthermore, different manufacturers of electronic equipment such as cameras may implement different mounting systems for installing their equipment. Moreover, various entities wishing to install electronic equipment outdoors may desire to facilitate different goals through the installation and/or or use specific models of electronic equipment depending on factors such as budget, purpose, design, regulations, and other factors. When installing such equipment, an additional concern is the difficulty and simplicity of the installation. If equipment is difficult to install, it may result in unnecessarily lost time, incorrect installation, or other undesirable outcomes.

It is therefore an objective of the present invention to provide a modular, multipurpose enclosure for a telecommunications unit that protects any internal electronic components from the elements and facilitates rapid and easy customization and installation. The enclosure of the present invention allows users flexibility in choice of equipment, such as cameras, access controls, speakers, sensors, communications antennas, or other equipment to install and use, in addition to ease of installation of the equipment to the enclosure as well as installation of the enclosure itself.

Additional advantages of the invention will be set forth in part in the description which follows, and in part will be obvious from the description, or may be learned by practice of the invention. Additional advantages of the invention may be realized and attained by means of the instrumentalities and combinations particularly pointed out in the detailed description of the invention section. Further benefits and advantages of the embodiments of the invention will become apparent from consideration of the following detailed description given with reference to the accompanying drawings, which specify and show preferred embodiments of the present invention.

DETAIL DESCRIPTIONS OF THE INVENTION

All illustrations of the drawings are for the purpose of describing selected versions of the present invention and are not intended to limit the scope of the present invention. The present invention is to be described in detail and is provided in a manner that establishes a thorough understanding of the present invention. There may be aspects of the present invention that may be practiced or utilized without the implementation of some features as they are described. It should be understood that some details have not been described in detail in order to not unnecessarily obscure focus of the invention. References herein to "the preferred embodiment", "one embodiment", "some embodiments", or "alternative embodiments" should be considered to be illustrating aspects of the present invention that may potentially vary in some instances, and should not be considered to be limiting to the scope of the present invention as a whole.

The present invention is a modular multipurpose enclosure, more specifically intended for use as an enclosure and mounting means of a modular, multipurpose telecommunications unit capable of various electronic monitoring, communication, broadcasting, interfacing, and/or other functions. The telecommunications unit may receive various accessories installed through mounting to the enclosure and electronic connection to the electronic processing components of the telecommunications unit. The telecommunications enclosure is rugged and weatherproof, so that the telecommunications unit may be installed in any desirable location with minimal risk of failure due to weather damage. The telecommunications unit is particularly suited for video monitoring and surveillance, though various other purposes may be fulfilled thereby through customizable installation of various electronic equipment to the telecommunications unit by a user as desired. Multiple camera units or other appliances may be mounted to the various sides of the enclosure, enabling a wide field of coverage for video monitoring purposes. More particularly, the telecommunications unit, which may be alternatively referred to as "Grid Surfer," is designed around the premise of providing all compatible networking and video appliances protection from the elements in an outdoors installation setting, while providing the entity tasked with installing the Grid Surfer with a convenient "plug and play" experience. The Grid Surfer provides a customizable structural and electronics platform for installing a wide range of various desirable appliances, such as various types of and/or mounts for video cameras with various features suitable for various applications as desired by the installer. As such, the Grid Surfer is a unified telecommunications unit, capable of connecting to various wireless communication networks and facilitating the use of various electronic appliances as previously discussed.

In general, referring to FIGS. 1-6, the present invention comprises a plurality of walls 1 comprising a first lateral wall 12, a second lateral wall 14 and a rear wall 16, in addition to a top 2, a bottom 3, a door 4, and a plurality of mounting bulkheads 5. In the preferred embodiment of the present invention, the plurality of walls 1, the top 2, the bottom 3, the door 4, and the plurality of mounting bulkheads 5 are constructed of aluminum or another high thermal conductivity material, such that the enclosure of the present invention has innate convection cooling properties and acts as its own heat sink in order to cool the various electronic components contained within the enclosure of the present invention when in use as a telecommunications unit. The form factor of the enclosure of the present invention in the preferred embodiment is a rectangular prism, although it may be understood that the shape of the enclosure of the present invention is not of high importance and may take any desired shape that facilitates the spirit of the present invention as illustrated herein.

In the preferred embodiment, the rear wall 16 is terminally connected between the first lateral wall 12 and the second lateral wall 14, with the top 2 being terminally connected atop the first lateral wall 12, the second lateral wall 14, and the rear wall 16, and the bottom 3 being terminally connected to the first lateral wall 12, the second lateral wall 14, and the rear wall 16, opposite the top 2, forming the boundaries of the rectangular prism shape. The door 4 is terminally and hingedly connected to the first lateral wall 12 opposite the rear wall 16 along the first lateral wall 12, and is configured to selectively occlude an access aperture 7 at a front of the enclosure opposite the rear wall 16, through which any electronics or other components internal to the enclosure of the telecommunications unit may be accessed for repair, maintenance, installation, or other purposes.

Each of the plurality of mounting bulkheads 5 is removably and externally attached to one of the plurality of walls 1, preferably through flat head screws or other fasteners, though it is contemplated any suitable fastening means may be utilized. One or more mounting bulkheads 5 may further be attached to the door 4 in a similar fashion. The use and implementation of the plurality of mounting bulkheads 5 is the primary unique feature of the present invention disclosed herein. The intended purpose of the mounting bulkheads 5 is to facilitate rapid and easy installation of a wide variety of mountable electronic appliances such as, but not limited to, cameras. Each of the mounting bulkheads 5 comprises a body 52, a plurality of mounting holes 54, and a cable passthrough hole 56. The plurality of mounting holes 54 and the cable passthrough hole 56 traverse through the body 52 for each of the plurality of mounting bulkheads 5, wherein the body 52 has generally flat, plate-like geometry. Since different manufacturers have different mounting kits and/or mounting hole arrangements for their outdoor cameras or other relevant appliances, the present invention seeks to provide a turnkey solution for mounting any desirable camera unit or other electronic equipment by providing the plurality of mounting holes 54 arranged into a specified hole pattern 6, wherein the specified hole pattern 6 is configured to accommodate a plurality of different camera mounts suitable for mounting various camera units from different manufacturers.

Additionally, the preferred embodiment of the present invention further comprises a plurality of gaskets 8, each gasket being positioned between one of the plurality of mounting bulkheads 5 and one of the plurality of walls 1, such that each of the plurality of gaskets 8 forms a waterproof seal between one of the plurality of mounting bulkheads 5 and one of the plurality of walls 1, facilitating the desired rugged, outdoor weatherproofing aspect of the present invention. The plurality of gaskets 8 may be constructed from any suitable material, such as, but not limited to, silicone, rubber, neoprene, or other sealing materials, or other sealing means may be utilized as desired in various embodiments.

The cable passthrough hole 56 is provided to accommodate any wired connections that may be necessary to be connected between a mounted camera or other electronics unit and the internal processing electronics of the telecommunications unit. Furthermore, the enclosure of the present invention comprises its own holes which correspond to the specified hole pattern 6 and the cable passthrough hole 56. The holes of the enclosure corresponding to the cable passthrough hole 56 of the mounting bulkheads 5 are preferably smaller than the cable passthrough hole 56 in order to allow for a liquid tight rubber cap to be inserted to seal the cable passthrough hole 56 and any cables retained within against the outdoor elements.

Figure 1:
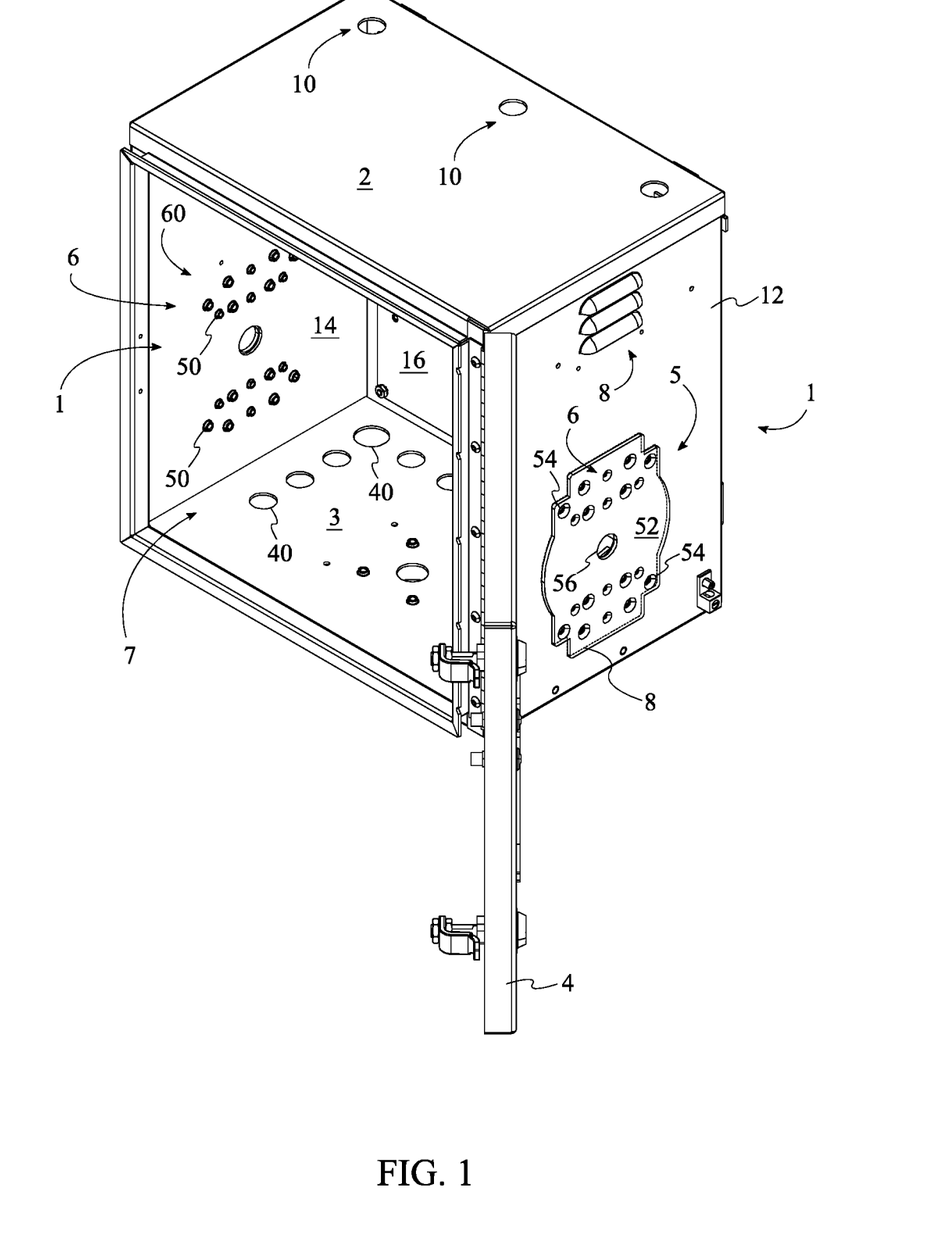
FIG. 1 is a raised perspective view of the present invention with the door in an opened state.
Figure 2:
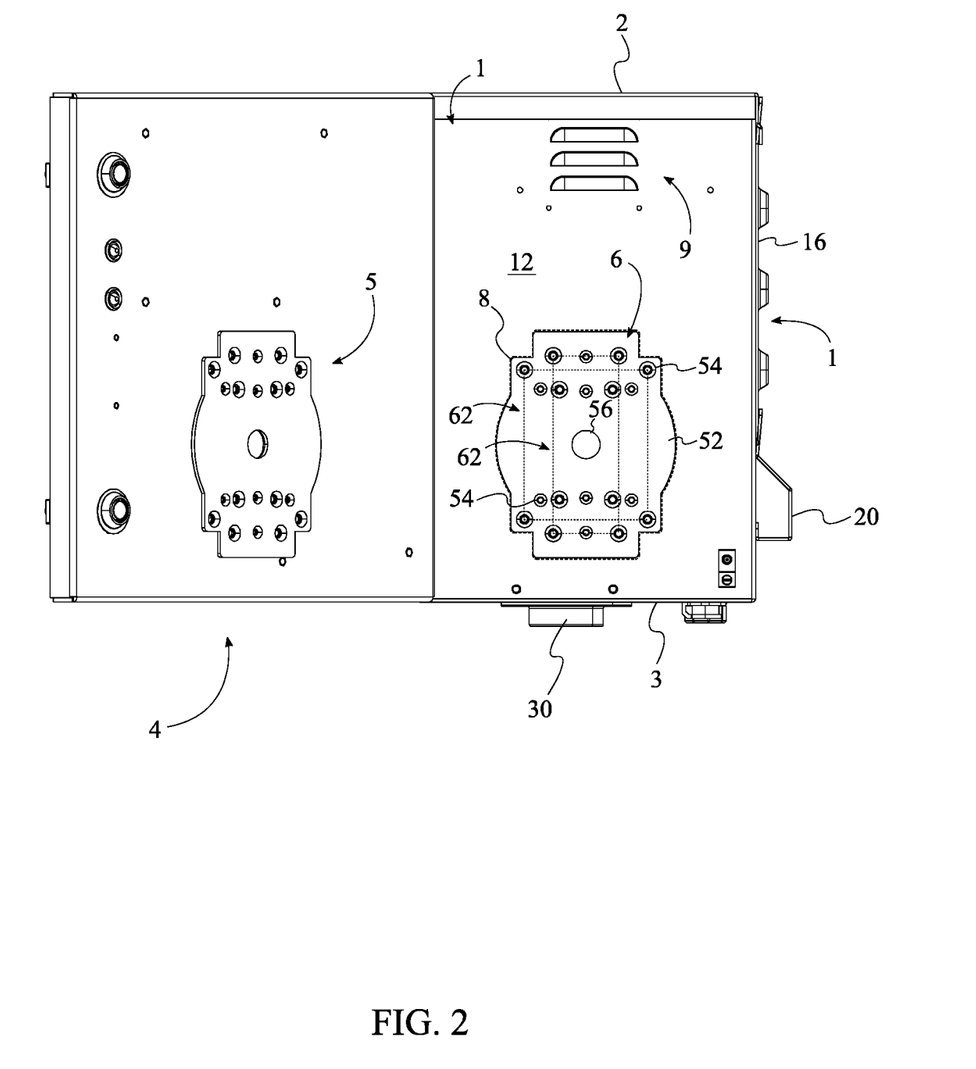
FIG. 2 is a left view of the present invention with the door in an opened state.
Figure 3:
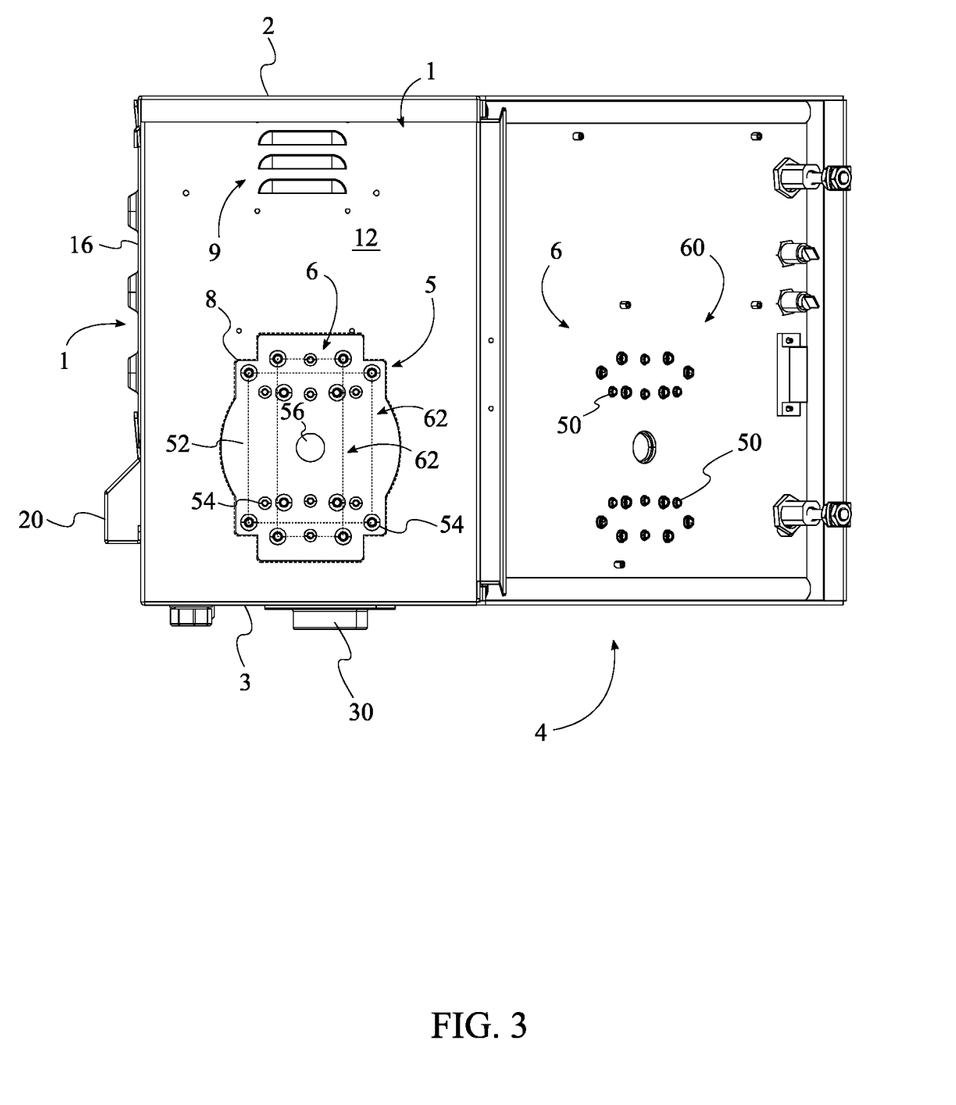
FIG. 3 is a right view of the present invention with the door in an opened state.

In the preferred embodiment of the present invention, the specified hole pattern 6 comprises a plurality of hole templates 62 as shown in FIGS. 2-3, with each of the plurality of hole templates 62 being configured to correspond to one of a plurality of predefined accessory mount templates. The specific arrangement of any given hole template may vary; for example, some hole templates will comprise four holes arranged in a rectangular shape. In FIGS. 2-3, the hole templates 62 are represented by the dashed lines connecting multiple mounting holes 54, with the two shown hole templates 62 shown each having four holes arranged in a rectangular configuration. The predefined accessory mount templates may be understood to correspond to hole patterns of existing camera mounts. Preferably, each of the plurality of hole templates 62 is positioned centrally on the body 52 for each of the plurality of mounting bulkheads 5; this is to ensure that any electrical cables necessary to be connected between a camera or other mounted unit and the internal electronic of the telecommunications unit are properly aligned with the cable passthrough hole 56. An exemplary embodiment of the specified hole pattern 6 is shown in FIGS. 1-3 and 5, through the specified hole pattern 6 should be understood to not be limited to the disclosed exemplary embodiment, and the specified hole pattern 6 may vary in different embodiments. In general, the mounting bulkheads 5 are preferably symmetrical in two directions parallel to the planar geometry of the mounting bulkheads 5, said dimensions being understood to be a vertical direction between the top 2 and bottom 3 of the enclosure, and a lateral direction perpendicular to the vertical direction and parallel to the surface of the mounting bulkheads 5.

Referring to FIGS. 1 and 3, the preferred embodiment of the present invention comprises further comprises a plurality of mounting nuts 50 corresponding to the specified hole pattern 6. Each of the plurality of mounting nuts 50 is internally threaded and embedded within one of the walls from the plurality of walls 1. In order to install a camera or other electronic unit to one of the mounting bulkheads 5, the user will drive screws or other threaded fasteners through mounting holes 54 in the camera, the mounting holes 54 of one of the mounting bulkheads 5, and into corresponding mounting nuts 50 embedded within the enclosure.

To correspond properly with the specified hole patterns 6 of the mounting bulkheads 5, the plurality of mounting nuts 50 are is defined herein to comprise a plurality of groups of mounting nuts 60. Each group of mounting nuts 50 is arranged according to the specified hole pattern 6, and positioned on one of the plurality of walls 1 or in another location on the enclosure where it is desirable to allow mounting of a camera or other electronic appliance, such as, but not limited to, the door 4. After fabrication, with the positions of the groups of mounting nuts 60 defined, each of the mounting bulkheads 5 is fastened to the enclosure so that the plurality of mounting holes 54 of each of the plurality of mounting bulkheads 5 is aligned with one of the plurality of groups of mounting nuts 60. Thus, the specific placement of any given mounting bulkhead 5 is dictated by the placement of one of the groups of mounting nuts 60 on one of the plurality of walls 1 and/or the door 4. In the preferred embodiment, each of the plurality of mounting nuts 50 is an elliptical pem nut, acting as a lock washer to facilitate secure installation. However, it is not necessarily a requirement for the plurality of mounting nuts 50 to be elliptical pem nuts.

During use in an outdoor setting, the ambient temperature may rise to levels undesirable for proper function and lifespan of electronics; furthermore, the electronics of the telecommunications unit themselves may produce heat during operation. As such, it is a further objective of the present invention to provide adequate cooling to any electronic components contained within the telecommunications unit. To this end, as previously mentioned, the enclosure of the present invention is preferably fabricated from a high thermal conductivity material such as, but not limited to, aluminum, in order to provide innate convection cooling properties. To further facilitate cooling of the internal electronics of the telecommunications unit, the preferred embodiment of the present invention further comprises at least one airflow vent 9. Each of the at least one airflow vent 9 is positioned on one of the plurality of walls 1, such that each airflow vent 9 is configured to facilitate airflow through one of the plurality of walls 1. Additional airflow vents 9 may similarly be located on the door 4, top 2, or bottom 3 as desired. The airflow vents 9 may vary in different embodiments, but in general, each airflow vent 9 comprises at least one aperture and at least one louver or similar vent cover. The aperture traverses through the enclosure, and the louver is positioned around the aperture in order to prevent rain, snow, dust, or other potentially harmful environmental elements from encroaching into the interior space of the enclosure. In use, one or more fans may be placed adjacent to the airflow vents 9 in order to force airflow through the enclosure.

Figure 4:
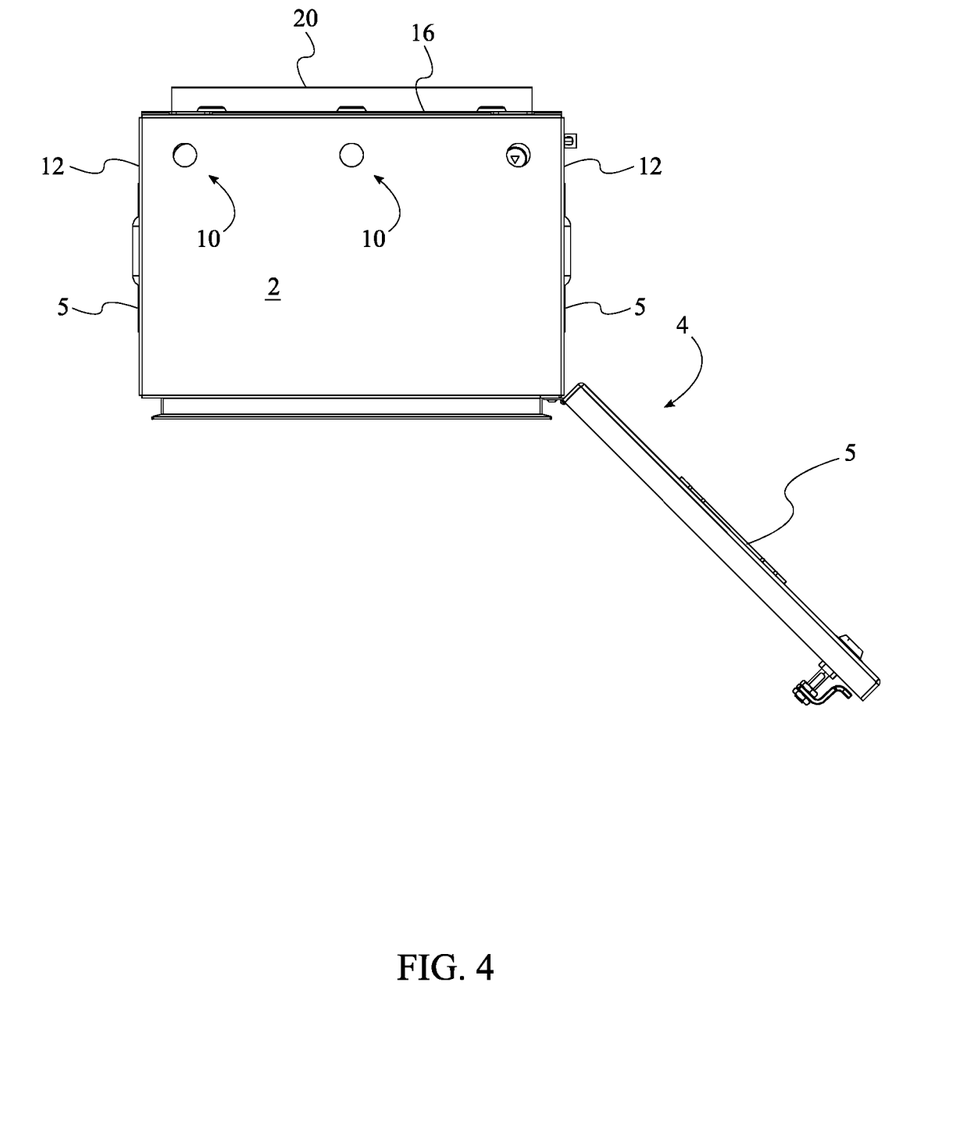
FIG. 4 is a top view of the present invention with the door in an opened state.
Figure 5:
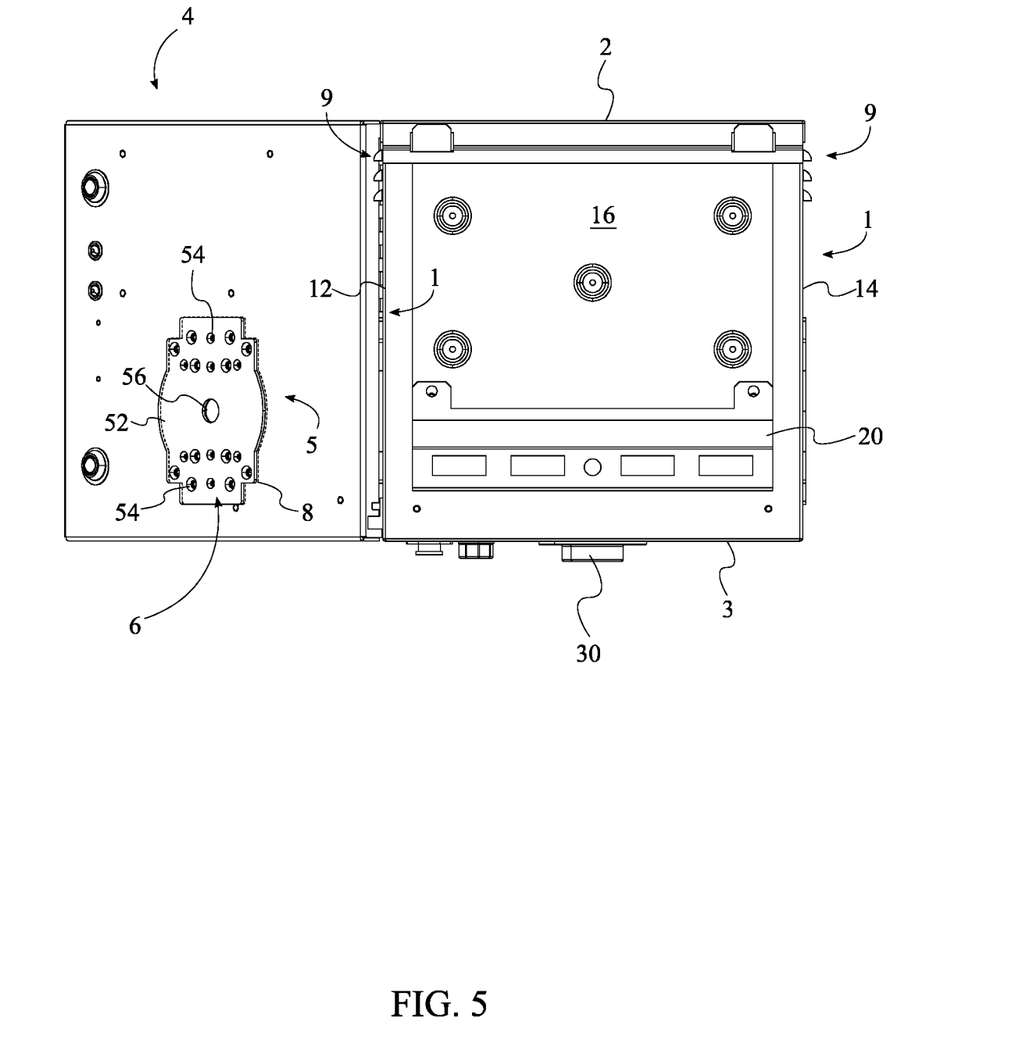
FIG. 5 is a rear view of the present invention with the door in an opened state.
Figure 6:
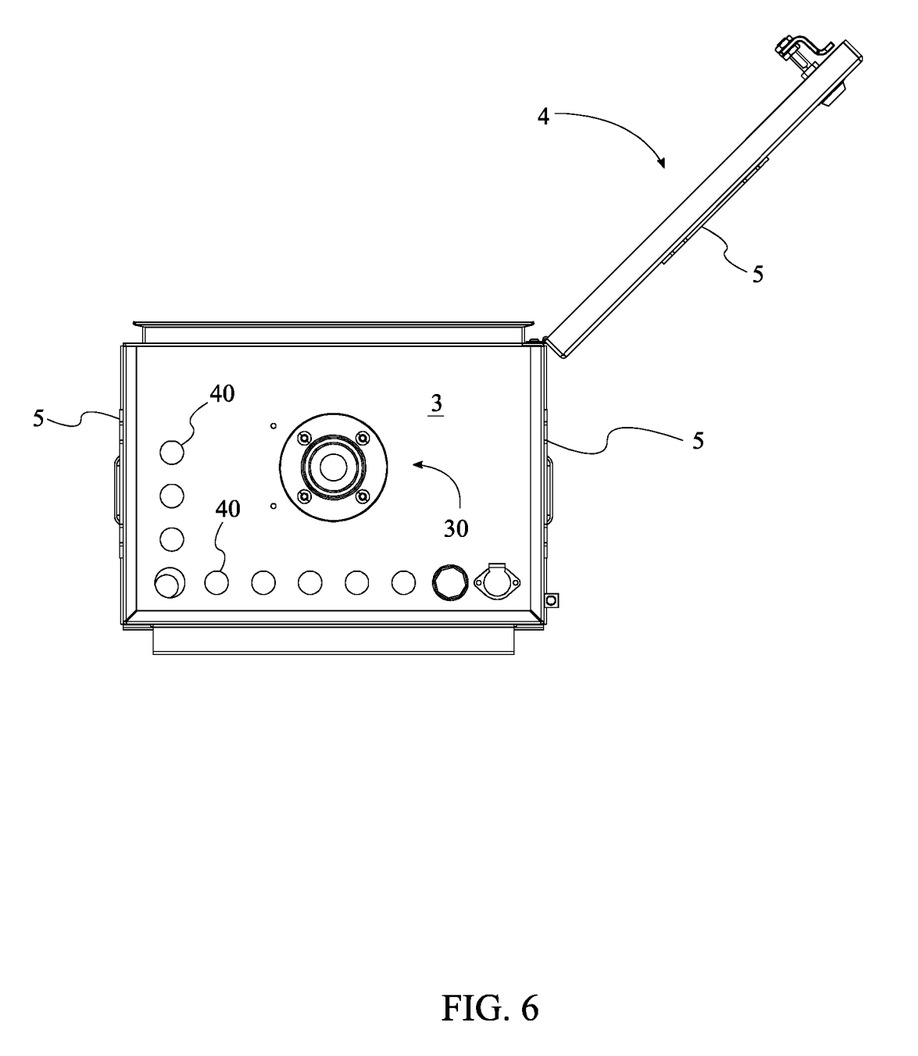
FIG. 6 is a bottom view of the present invention with the door in an opened state.

The preferred embodiment of the enclosure of the present invention may further comprise various other features, such as, but not limited to, additional holes, mounts, brackets, and the like, for mounting additional items to the present invention or for mounting the present invention in a desired location. In the preferred embodiment, the present invention further comprises at least one antenna mount hole 10, as shown in FIGS. 1 and 4. Preferably, each of the at least one antenna mount hole 10 traverses through the top 2, and each of the at least one antenna mount hole 10 is configured to receive a wireless communication antenna. In some embodiments, the at least one antenna mount hole 10 of the present invention may comprise three antenna mount holes 10. The three antenna mount holes 10 may be distributed linearly across the top 2, or in any other desired arrangement. The antenna mount holes 10 may be configured to receive cellular networking antennas, Wi-Fi antennas, GPS antennas, and the like. The antenna mount holes 10 may be covered by weatherproof hole plugs when not in use. The antenna mount holes 10 allow for an almost tool-less "plug and play" direct mounting solution to the enclosure of the present invention for many cellular, Wi-Fi and GPS antenna types.

In some embodiments, the present invention further comprises at least one pendant mount 30 positioned on the bottom 3. The pendant mount 30 allows additional cameras or other appliances, accessories or fixtures to be mounted to the bottom 3 of the enclosure. The pendant mount 30 may comprise a specified hole pattern 6 similar to the mounting bulkheads 5 in some embodiments, or the pendant mount 30 may be a single standardized or custom mounting point in various embodiments.

In some embodiments, the present invention further comprises a plurality of cable inlets 40. Each of the plurality of cable inlets 40 is positioned on and traverse through the bottom 3 of the enclosure of the present invention, and allow for various electrical cables to be connected between the internal electronics of the telecommunications unit to external power sources, data repositories, servers, control units, or the like. The plurality of cable inlets 40 may further be sealed against the elements through any suitable means.

The preferred embodiment of the present invention further comprises at least one mounting bracket 20 that is externally connected to the rear wall 16. The mounting bracket 20 may be referred to as an "easy mount bracket" in some embodiments. The mounting bracket 20 is intended to facilitate mounting of the enclosure of the present invention to a desired location. The mounting bracket 20 is preferably constructed of aluminum, and provides several slots to allow for mounting elements, such as heavy-duty stainless-steel strapping and strut mounting elements. In some embodiments, the mounting bracket 20 is oriented perpendicular to the first lateral wall 12 and the second lateral wall 14, or horizontally, and is preferably positioned equidistantly between the first lateral wall 12 and the second lateral wall 14. In some embodiments, the mounting bracket 20 may be configured to laterally receive a rectangular member for mounting purposes. The mounting bracket 20 further preferably comprises a deadbolt hole positioned centrally on the mounting bracket 20, equidistantly between the first lateral wall 12 and the second lateral wall 14.

It is further contemplated that the enclosure of the present invention may, in various embodiments, further comprise additional relevant components and features, such as, but not limited to, status indicator lights, alarms, security locks, sensors, user interfaces, communication devices, or other features.

Furthermore, it may be noted that a telecommunications unit that utilizes the enclosure of the present invention may include various electronic components, such as, but not limited to: one or more cellular modems, cellular antennas, Wi-Fi antennas, GPS antennas, servers, power supply units, power breakers, surge protectors, power relays, web control units, low voltage detectors, universal power supply transfers, battery packs, network switching units, processing units, cellular gateway units, industrial computing platforms, data storage devices, data inputs/outputs, and other relevant components.

Although the invention has been explained in relation to its preferred embodiment, it is to be understood that many other possible modifications and variations can be made without departing from the spirit and scope of the invention as hereinafter claimed.

What is claimed is:

1. A modular multipurpose telecommunications unit enclosure comprising:
   a plurality of walls comprising a first lateral wall, a second lateral wall, and a rear wall;
   a top;
   a bottom;
   a door;
   a plurality of mounting bulkheads;
   the rear wall being terminally connected between the first lateral wall and the second lateral wall;
   the top being terminally connected atop the first lateral wall, the second lateral wall, and the rear wall;

the bottom being terminally connected to the first lateral wall, the second lateral wall, and the rear wall, opposite the top;

the door being terminally and hingedly connected to the first lateral wall opposite the rear wall along the first lateral wall;

each of the plurality of mounting bulkheads being removably and externally attached to one of the plurality of walls;

each of the plurality of mounting bulkheads comprising a body, a plurality of mounting holes, and a cable passthrough hole;

the plurality of mounting holes and the cable passthrough hole traversing through the body for each of the plurality of mounting bulkheads;

the plurality of mounting holes being arranged into a specified hole pattern, wherein the specified hole pattern is configured to accommodate a plurality of camera mounts; and the cable passthrough hole being centrally positioned on the body for each of the plurality of mounting bulkheads.

2. The modular multipurpose telecommunications unit enclosure as claimed in claim 1 comprising:

the plurality of walls, the top, the bottom, the door, and the plurality of mounting bulkheads being constructed of a high thermal conductivity material.

3. The modular multipurpose telecommunications enclosure as claimed in claim 1 comprising:

the plurality of walls, the top, the bottom, the door, and the plurality of mounting bulkheads being constructed of aluminum.

4. The modular multipurpose telecommunications unit enclosure as claimed in claim 1 comprising:

a plurality of gaskets; and each of the plurality of gaskets being positioned between one of the plurality of mounting bulkheads and one of the plurality of walls, wherein each of the plurality of gaskets forms a waterproof seal between one of the plurality of mounting bulkheads and one of the plurality of walls.

5. The modular multipurpose telecommunications unit enclosure as claimed in claim 1 comprising:

the specified hole pattern comprising a plurality of hole templates;

each of the plurality of hole templates being configured to correspond to one of a plurality of predefined accessory mount templates; and each of the plurality of hole templates being positioned centrally on the body for each of the plurality of mounting bulkheads.

6. The modular multipurpose telecommunications unit enclosure as claimed in claim 1 comprising:

at least one airflow vent; and each of the at least one airflow vent being positioned on one of the plurality of walls, wherein each airflow vent is configured to facilitate airflow through one of the plurality of walls.

7. The modular multipurpose telecommunications unit enclosure as claimed in claim 1 comprising:

at least one antenna mount hole;

each of the at least one antenna mount hole traversing through the top; and each of the at least one antenna mount hole being configured to receive a wireless communication antenna.

8. The modular multipurpose telecommunications unit enclosure as claimed in claim 1 comprising:

at least one mounting bracket;

the mounting bracket being externally connected to the rear wall;

the mounting bracket being oriented perpendicular to the first lateral wall and the second lateral wall; and the mounting bracket being positioned equidistantly between the first lateral wall and the second lateral wall.

9. The modular multipurpose telecommunications unit enclosure as claimed in claim 8 comprising:

the mounting bracket comprising a deadbolt hole positioned equidistantly between the first lateral wall and the second lateral wall.

10. The modular multipurpose telecommunications unit enclosure as claimed in claim 1 comprising:

at least one pendant mount; and the at least one pendant mount being positioned on the bottom.

11. The modular multipurpose telecommunications unit enclosure as claimed in claim 1 comprising:

a plurality of cable inlets; and each of the plurality of cable inlets being positioned on the bottom.

12. The modular multipurpose telecommunications unit enclosure as claimed in claim 1 comprising:

a plurality of mounting nuts;

each of the plurality of mounting nuts being internally threaded;

each of the plurality of mounting nuts being embedded within one of the walls from the plurality of walls;

the plurality of mounting nuts comprises a plurality of groups of mounting nuts;

each group of mounting nuts being arranged according to the specified hole pattern; and the plurality of mounting holes of each of the plurality of mounting bulkheads being aligned with one of the plurality of groups of mounting nuts.

13. The modular multipurpose telecommunications unit enclosure as claimed in claim 12 comprising:

each of the plurality of mounting nuts being an elliptical pem nut.

* * * * *